(12) United States Patent
Seddon

(10) Patent No.: US 11,694,937 B2
(45) Date of Patent: *Jul. 4, 2023

(54) SEMICONDUCTOR WAFER AND METHOD OF PROBE TESTING

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/457,113

(22) Filed: Dec. 1, 2021

(65) Prior Publication Data

US 2022/0084895 A1 Mar. 17, 2022

Related U.S. Application Data

(63) Continuation of application No. 16/656,182, filed on Oct. 17, 2019, now Pat. No. 11,257,724, which is a continuation-in-part of application No. 15/907,931, filed on Feb. 28, 2018, now Pat. No. 10,461,000, which is a continuation-in-part of application No. 15/704,246, filed on Sep. 14, 2017, now Pat. No.
(Continued)

(51) Int. Cl.
| | |
|---|---|
| *H01L 23/58* | (2006.01) |
| *H01L 29/10* | (2006.01) |
| *H01L 21/66* | (2006.01) |
| *H01L 21/683* | (2006.01) |
| *G01R 31/28* | (2006.01) |
| *H01L 21/78* | (2006.01) |
| *H01L 21/304* | (2006.01) |

(52) U.S. Cl.
CPC .......... *H01L 22/34* (2013.01); *G01R 31/2831* (2013.01); *H01L 21/6836* (2013.01); *H01L 21/78* (2013.01); *H01L 22/12* (2013.01); *H01L 22/32* (2013.01); *G01R 31/2865* (2013.01); *H01L 21/304* (2013.01); *H01L 22/14* (2013.01); *H01L 2221/6834* (2013.01); *H01L 2221/68327* (2013.01); *H01L 2221/68381* (2013.01)

(58) Field of Classification Search
CPC combination set(s) only.
See application file for complete search history.

(56) References Cited

U.S. PATENT DOCUMENTS

| | | | |
|---|---|---|---|
| 9,793,186 B1 * | 10/2017 | Seddon | ............... H01L 21/6836 |
| 10,461,000 B2 * | 10/2019 | Seddon | ............... H01L 21/6836 |

(Continued)

OTHER PUBLICATIONS https://www.dictionary.com/browse/film# (Year: 1998).

*Primary Examiner* — Niki H Nguyen
(74) *Attorney, Agent, or Firm* — Adam R. Stephenson, Ltd.

(57) ABSTRACT

Implementations of methods of making a semiconductor device may include: providing a partial semiconductor wafer. The method may also include providing a wafer holder including a tape portion with one or more openings through the tape portion. The method may include mounting the partial semiconductor wafer over the one or more openings in the tape portion of the wafer holder and providing an electrical connection to the partial semiconductor wafer through the one or more openings in the tape portion during probe test.

20 Claims, 17 Drawing Sheets

Related U.S. Application Data 10,170,381, which is a continuation of application No. 15/230,875, filed on Aug. 8, 2016, now Pat. No. 9,793,186.

(56) References Cited

U.S. PATENT DOCUMENTS

| | | | |
|---|---|---|---|
| 11,257,724 B2* | 2/2022 | Seddon | H01L 21/78 |
| 2003/0095244 A1* | 5/2003 | Komatsu | G03F 7/707 |
| | | | 355/75 |
| 2010/0194423 A1 | 8/2010 | Tago et al. | |
| 2013/0076384 A1 | 3/2013 | Chang | |
| 2014/0051189 A1 | 2/2014 | Kai-Jun | |
| 2014/0203829 A1 | 7/2014 | Kamada | |
| 2014/0252641 A1 | 9/2014 | Lim et al. | |
| 2015/0001709 A1 | 1/2015 | Bao et al. | |
| 2015/0015288 A1* | 1/2015 | Ma | G01R 1/06738 |
| | | | 324/754.2 |
| 2015/0115463 A1* | 4/2015 | Pelley | H01L 23/36 |
| | | | 438/109 |

\* cited by examiner

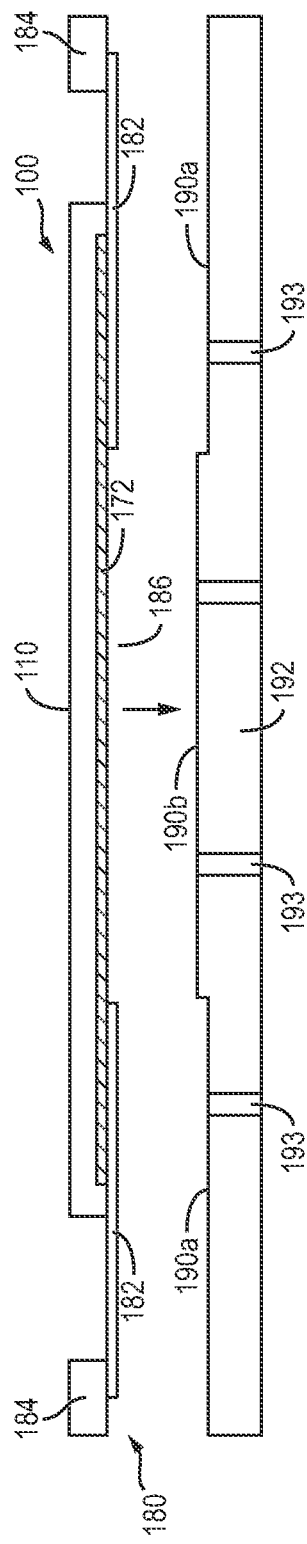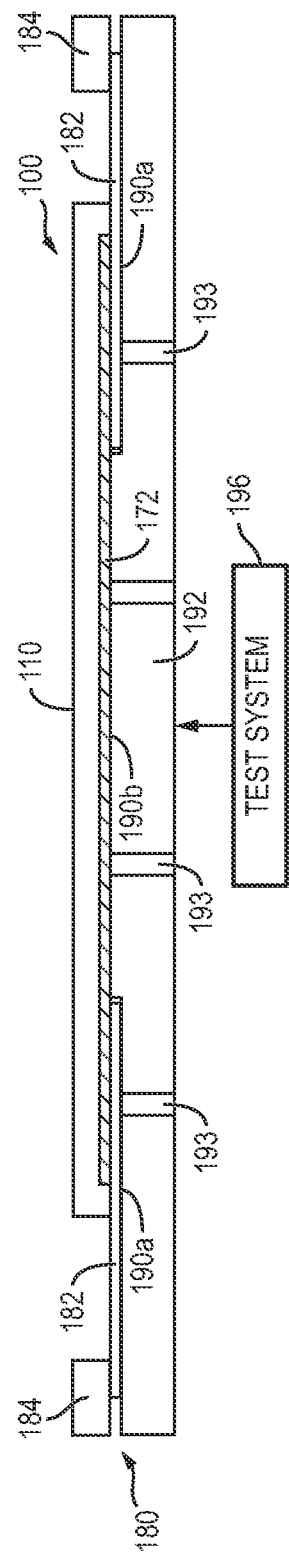

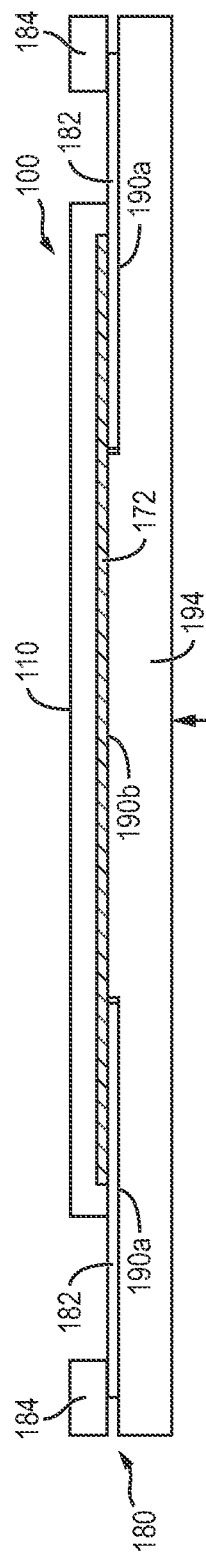
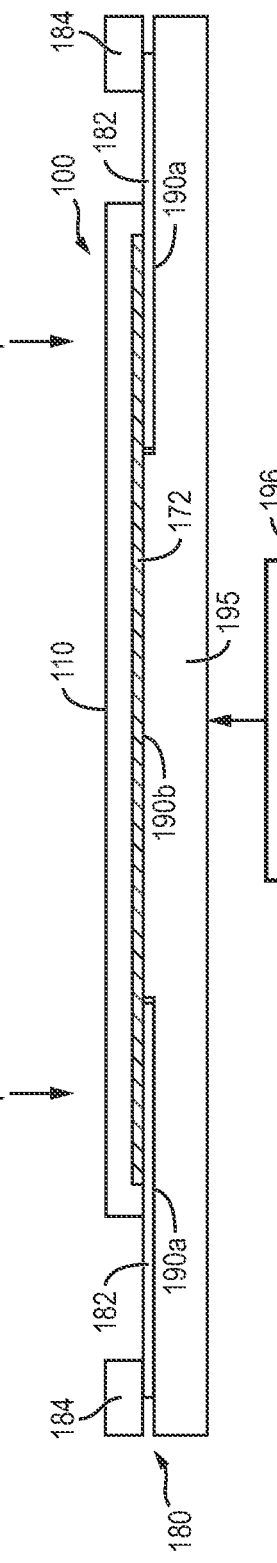

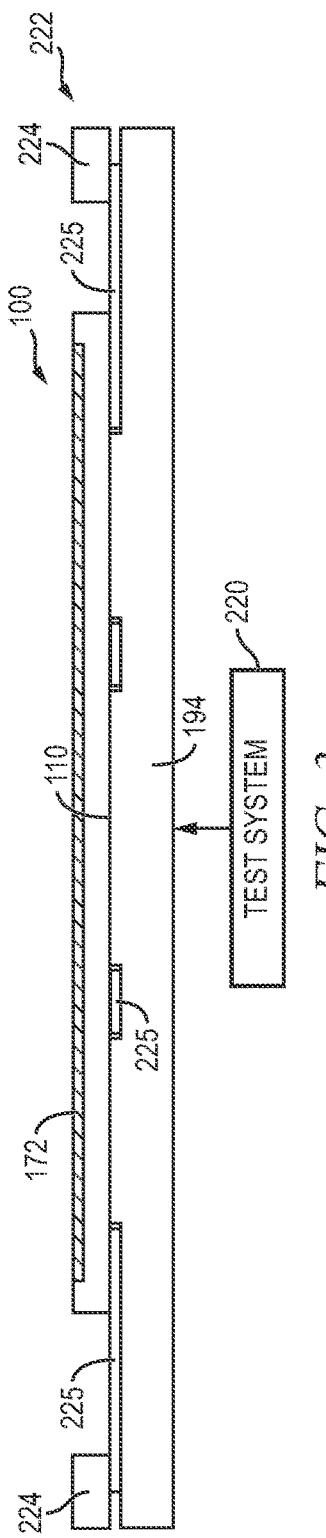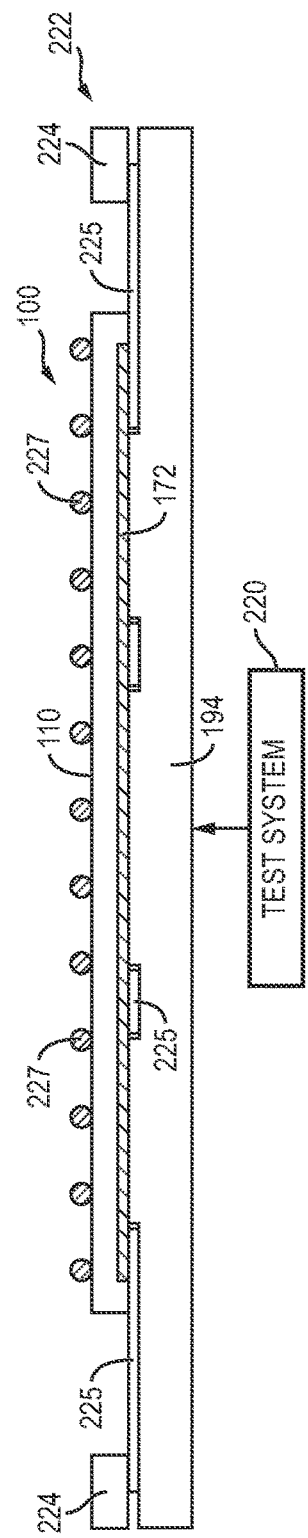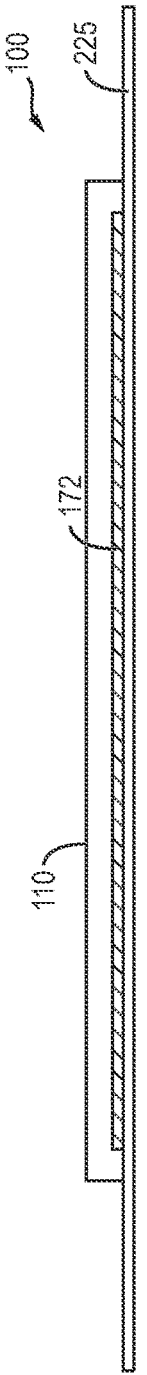

SEMICONDUCTOR WAFER AND METHOD OF PROBE TESTING

CROSS REFERENCE TO RELATED APPLICATIONS

This application is a continuation application of the earlier U.S. Utility patent application to Michael Seddon entitled "Semiconductor Wafer and Method of Probe Testing," application Ser. No. 16/656,182, filed Oct. 17, 2019 now, which application is a continuation-in-part application of the earlier U.S. Utility patent application to Michael Seddon entitled "Semiconductor Wafer and Method of Probe Testing," application Ser. No. 15/907,931, filed Feb. 28, 2018 now issued as U.S. Pat. No. 10,461,000, which application is a continuation-in-part of U.S. patent application Ser. No. 15/704,246, now U.S. Pat. No. 10,170,381, filed Sep. 14, 2017, now issued as U.S. Pat. No. 10,170,381, which application is a continuation of U.S. patent application Ser. No. 15/230,875, filed Aug. 8, 2016, now issued as U.S. Pat. No. 9,793,186, the disclosures of each of which are hereby incorporated entirely herein by reference.

BACKGROUND

1. Technical Field

Aspects of this document relate generally to semiconductor devices such as semiconductor wafers and die. More specific implementations involve semiconductor wafers having edge rings.

2. Background

A semiconductor wafer includes a base substrate material and plurality of semiconductor die formed on an active surface of the wafer separated by a saw street. Many applications involve reducing the thickness of the semiconductor die to minimize the size of the semiconductor package. Testing and inspection of the semiconductor wafer is used for quality assurance and reliability. Testing typically involves contacting a surface of the semiconductor wafer with a test probe/pin.

SUMMARY

Implementations of methods of making a semiconductor device may include: providing a partial semiconductor wafer. The method may also include providing a wafer holder including a tape portion with one or more openings through the tape portion. The method may include mounting the partial semiconductor wafer over the one or more openings in the tape portion of the wafer holder and providing an electrical connection to the partial semiconductor wafer through the one or more openings in the tape portion during probe testing.

Implementations of methods of making semiconductor devices may include one, all, or any of the following:

The partial semiconductor wafer may include one or more singulated die.

Providing the partial semiconductor wafer may include providing one or more stacked semiconductor die.

The method may further include forming one or more temporary electrically conductive traces over the tape portion.

The method may further include forming the one or more openings through the tape portion after mounting the tape portion to the wafer holder.

The method may further include forming one or more openings through the tape portion prior to mounting the tape portion to the wafer holder.

Implementations of apparatuses for probe testing a semiconductor device may include: a semiconductor wafer and a wafer holder including a film portion with one or more openings through the film portion. The semiconductor wafer may be mounted over the opening in the film portion of the wafer holder and the opening in the film portion may be configured to establish an electrical connection to the semiconductor wafer through the opening in the film portion during probe test.

Implementations of methods of making semiconductor devices may include one, all, or any of the following:

The semiconductor wafer may include a partial semiconductor wafer.

The semiconductor wafer may include one or more stacked semiconductor die.

The film portion of the wafer holder may be electrically conductive.

The film portion of the wafer holder may include carbon coated with gold, copper, aluminum, or any combination thereof.

The wafer holder may further include an adhesive on one or more edges of the wafer holder.

The one or more openings in the film portion may have a size smaller than a size of an individual die.

Implementations of apparatuses for probe testing a semiconductor device may include: a semiconductor wafer and a wafer holder including a support structure. The apparatuses may also include a conductive trace formed on the support structure. The semiconductor wafer may be mounted over the support structure of the wafer holder and the conductive trace is configured to establish an electrical connection to the semiconductor wafer through the conductive trace during probe testing.

Implementations of methods of making semiconductor devices may include one, all, or any of the following:

The support structure may include a film.

The support structure may include one or more strips of tape or film.

The semiconductor wafer may include a stacked partial semiconductor wafer.

A first surface of the semiconductor wafer may be oriented toward the support structure A second surface of the semiconductor wafer may be oriented toward the support structure.

The apparatus may further include one or more openings through the support structure.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended methods of testing semiconductor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such methods of testing semiconductor devices, and implementing components and methods, consistent with the intended operation and methods.

Figure 1A:
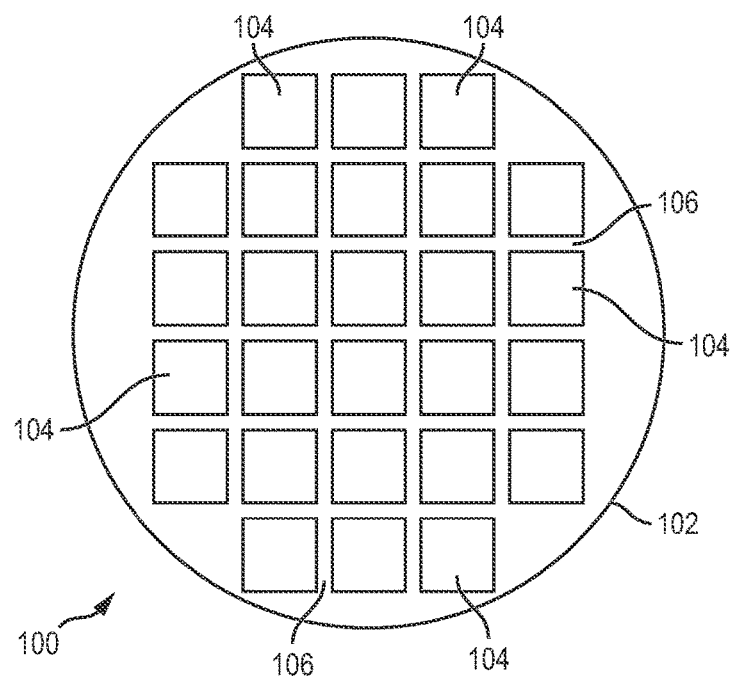
FIGS. 1a-1b illustrate a semiconductor wafer with a plurality of semiconductor die separated by a saw street.

FIG. 1a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by saw street 106, as described above. Saw street 106 provides singulation areas to separate semiconductor wafer 100 into individual semiconductor die 104. In one implementation, semiconductor wafer 100 has a width or diameter of 100-450 mm and thickness of 675-775 micrometers (m). In another implementation, semiconductor wafer 100 has a width or diameter of 150-300 mm.

Figure 1B:
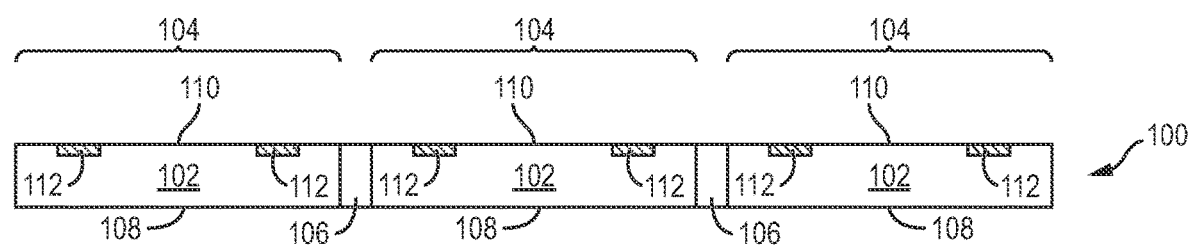

FIG. 1b shows a cross-sectional view of a portion of semiconductor wafer 100. Each semiconductor die 104 has a non-active back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as a digital signal processor (DSP), microcontroller, ASIC, power conversion, standard logic, amplifier, clock management, memory, interface circuit, and other signal processing circuit. Semiconductor die 104 may also contain an integrated passive device (IPD), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as interconnect pads electrically connected to the circuits on active surface 110.

In other implementations, semiconductor wafer 100 represents stacked semiconductor wafers, stacked semiconductor die on the wafer, silicon-on-insulator type wafers, stacked memory wafers, memory devices stacked on a ASIC wafer, stacked through silicon conductive vias (TSV) semiconductor wafers, or any other configuration of stacked wafers, stacked die on wafers, and stacked devices.

Figure 2A:
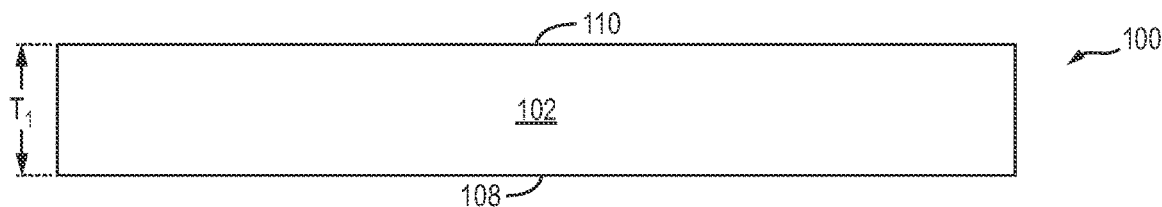
FIGS. 2a-2h illustrate a process of thinning a semiconductor wafer with an edge support ring.

FIGS. 2a-2h illustrate a process of thinning a semiconductor wafer with an edge support ring. FIG. 2a shows an entire area of semiconductor wafer 100 with back surface 108 and active surface 110. Semiconductor die 104 are present in active surface 110, see FIGS. 1a-1b, but not labeled for purposes of the present explanation. Semiconductor wafer 100 has a pre-grinding thickness $T_1$ of 675-775 µm.

Figure 2B:
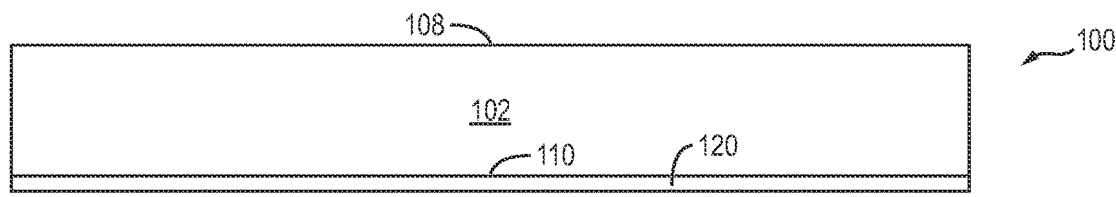
Figure 2C:
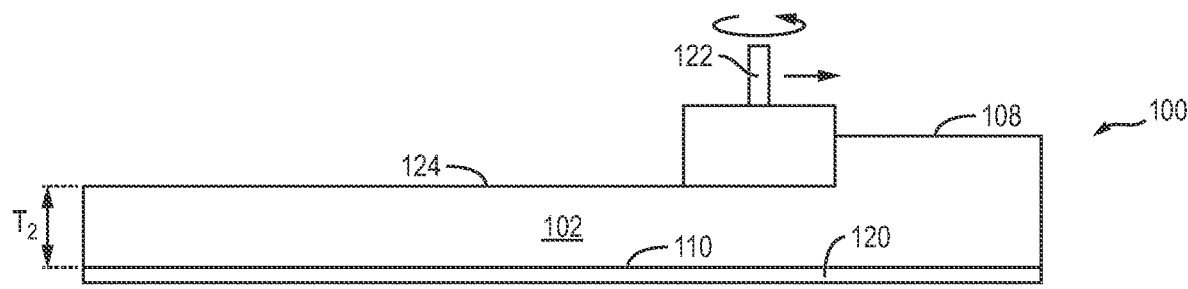

In FIG. 2b, semiconductor wafer 100 is inverted and mounted with active surface 110 oriented to backgrinding tape 120. In FIG. 2c, the entire back surface 108 undergoes a first backgrinding operation with grinder or grinding wheel 122 to remove a portion of base substrate material 102 down to surface 124. Semiconductor wafer 100 has a post-grinding thickness $T_2$ of 355 µm between active surface 110 and surface 124.

Figure 2D:
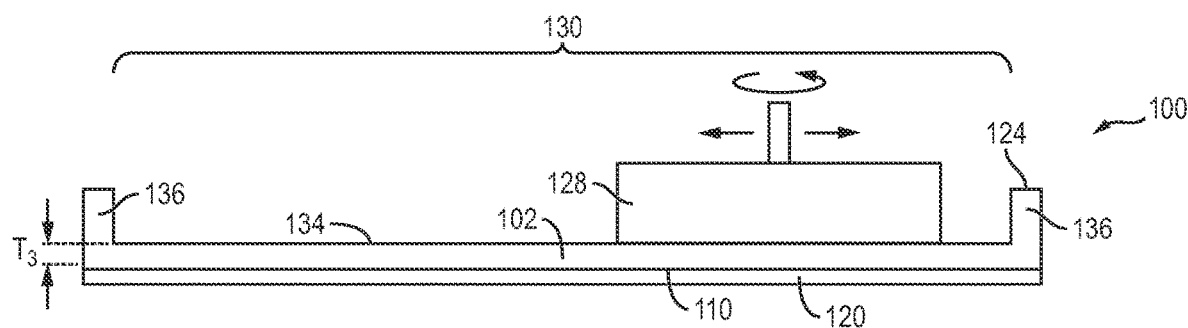

In FIG. 2d, a second grinding operation is applied to surface 124 using grinder or grinding wheel 128. Grinding wheel 128 moves in a cyclic, rotating pattern across an interior region or wafer grinding area 130 of semiconductor wafer 100 to remove a portion of base substrate material 102 down to surface 134. Grinding wheel 128 is controlled to leave edge support ring 136 of base substrate material 102 around a perimeter of semiconductor wafer 100 for structural support. In one implementation, the post-grinding thickness $T_3$ of semiconductor wafer 100 is 75 µm or less. In another implementation, the post-grinding thickness $T_3$ of semiconductor wafer 100 is 10-50 µm.

Figure 2E:
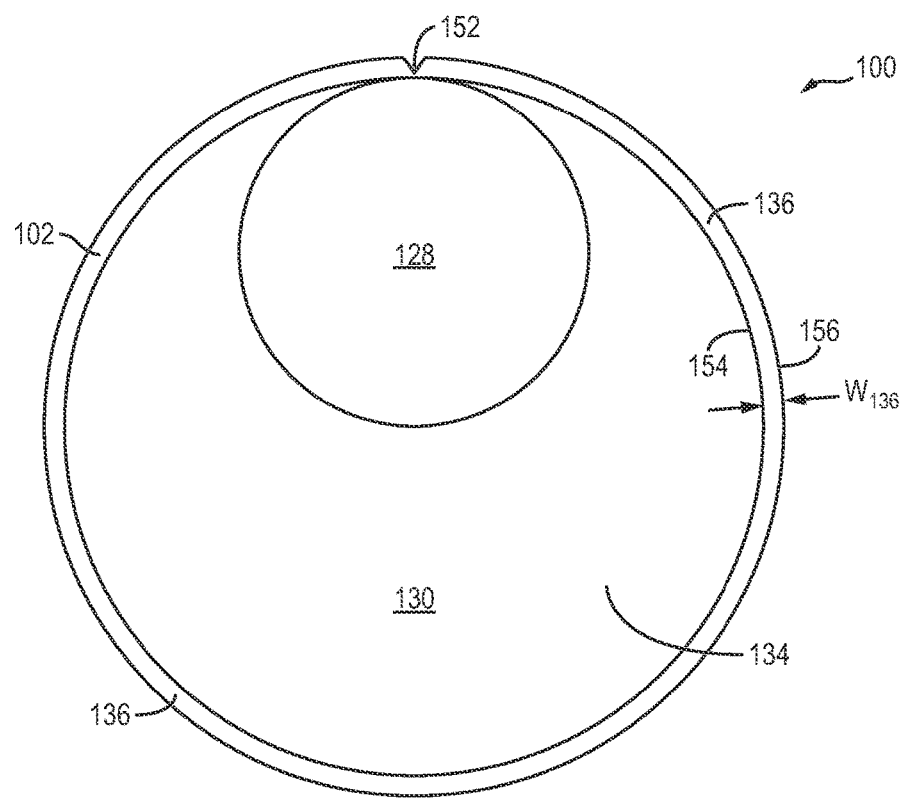

FIG. 2e shows a top view of grinding wheel 128 removing a portion of surface 134 of semiconductor wafer 100 to reduce the thickness of the semiconductor wafer, and correspondingly semiconductor die 104, in grinding area 130, while leaving edge support ring 136 of base substrate material 102 around a perimeter of the semiconductor wafer. Edge support ring 136 has a width $W_{136}$ of 3.0 mm±0.3 mm from inner wall 154 to outer edge 156 around semiconductor wafer 100. The height of edge support ring 136 is the first post-grinding thickness $T_2$, which is greater than the second post-grinding thickness $T_3$ of semiconductor wafer 100, to maintain structural integrity of the thinner semiconductor wafer.

Figure 2F:
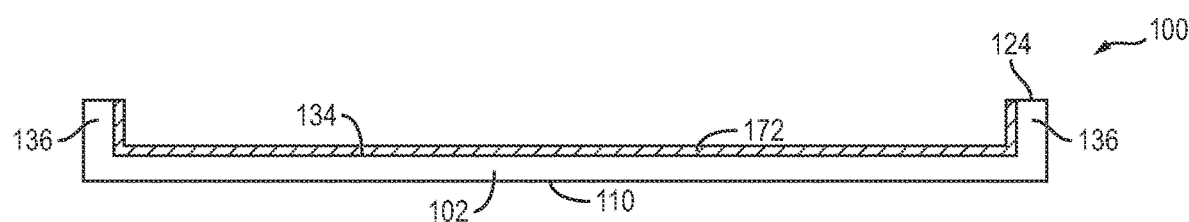

In FIG. 2f, a post-grinding stress relief etch is used to remove or reduce the damage in surface 134 of base substrate material 102 caused by the grinding process. Surface 134 of semiconductor wafer 100 is cleaned with a rinsing solution. An electrically conductive layer 172 is formed over surface 134 using PVD, CVD, electrolytic plating, electroless plating process, evaporation, or other suitable metal deposition process. Conductive layer 172 includes one or more layers of Al, Cu, Sn, Ni, Au, Ag, Ti, TiW, or other suitable electrically conductive material. Conductive layer 172 provides back-side electrical interconnect for semiconductor die 104. Conductive layer 172 makes connection to the circuits on active surface 110 through TSV. Conductive layer 172 is patterned into electrically common or electrically isolated portions according to the function of semiconductor die 104. Backgrinding tape 120 is removed by exposing the tape to ultraviolet (UV) light and peeling off.

Figure 2G:
Figure 2H:
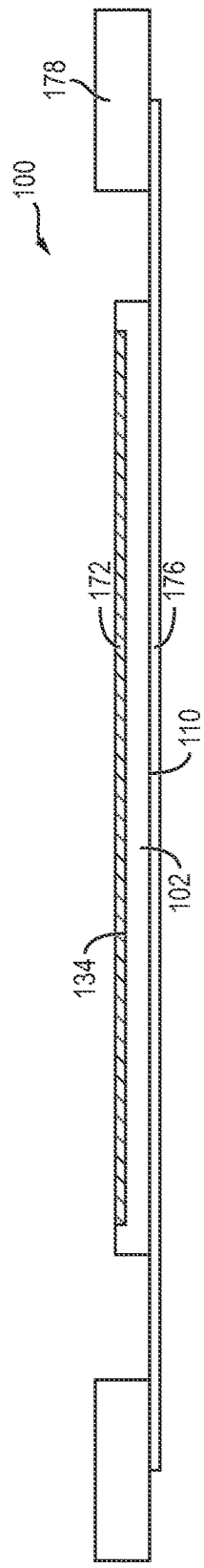

In FIG. 2g, the thinned semiconductor wafer 100 is mounted with active surface 110 oriented to tape portion 176 of film frame or carrier 178. In FIG. 2h, edge support ring 136 is removed to be planar with or just above (10-13 mm) conductive layer 172 or surface 134.

Figure 3A:
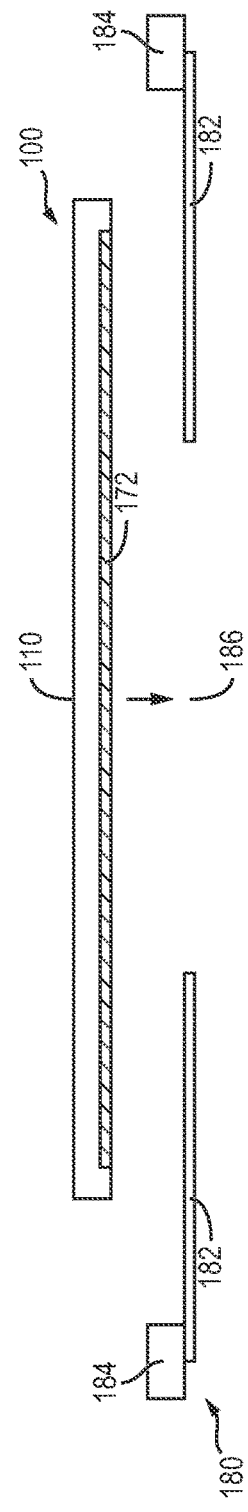
FIGS. 3a-3s illustrate a process of probe testing from a backside of the thinned semiconductor wafer through one or more openings in a tape portion of a film frame.
Figure 3B:
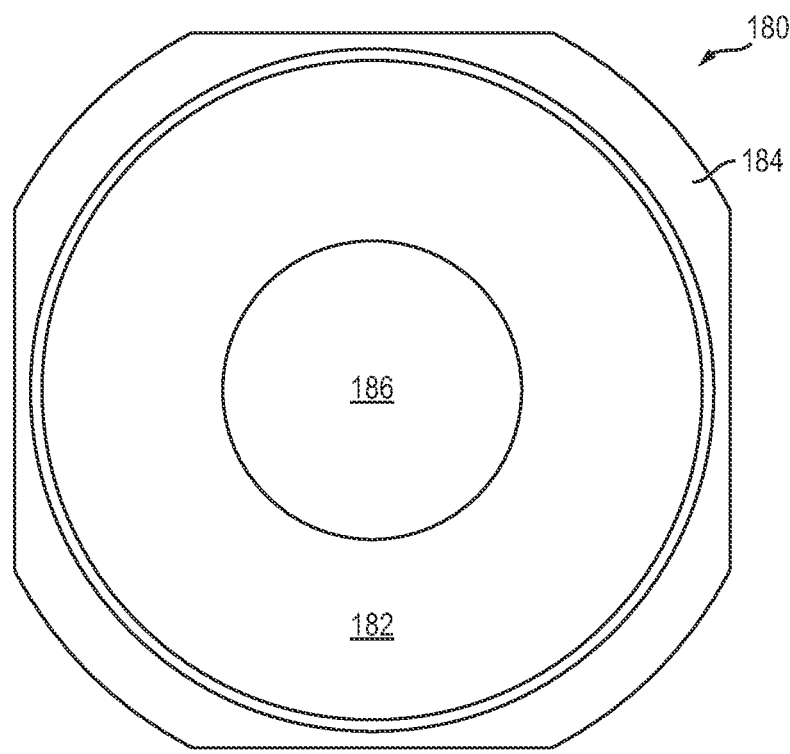
Figure 3C:
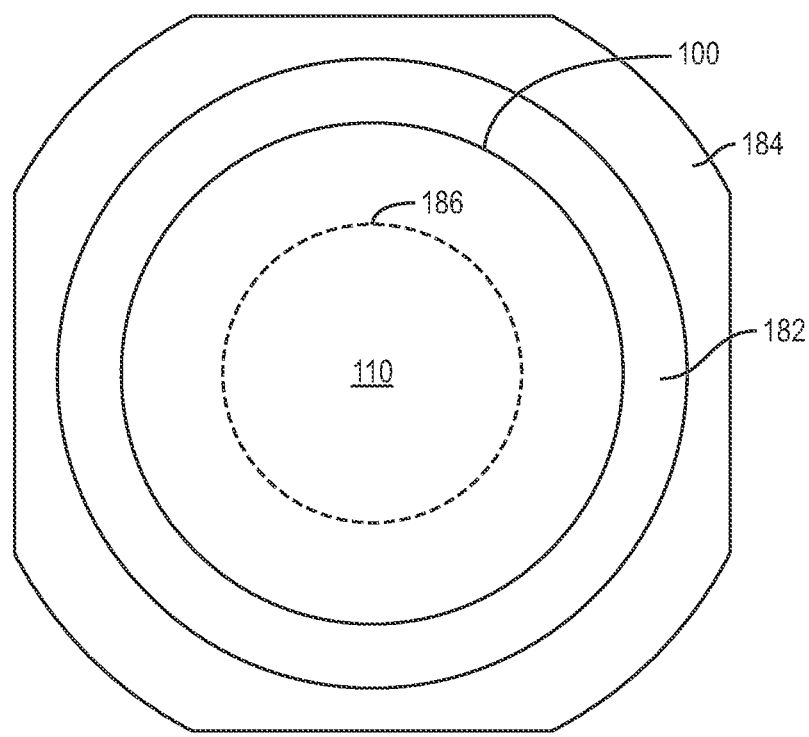
Figure 3H:
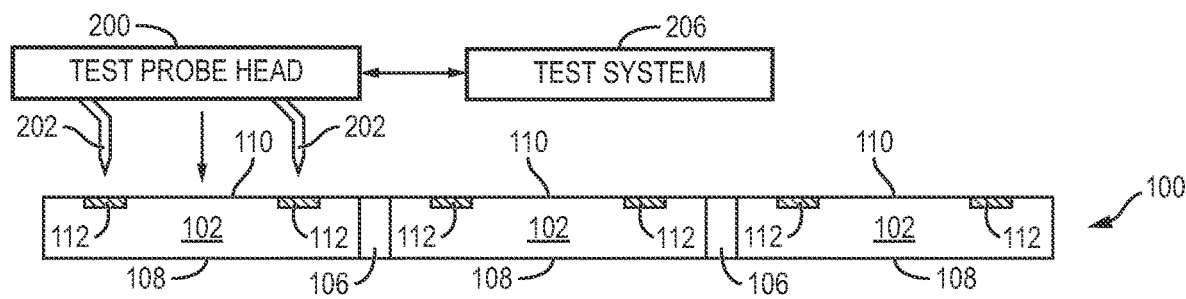
Figure 3I:
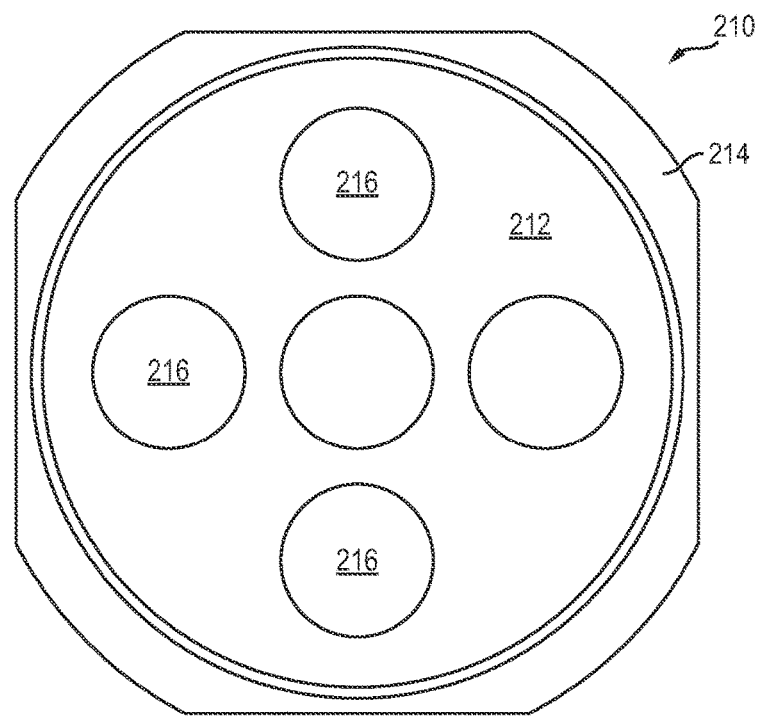
Figure 3J:
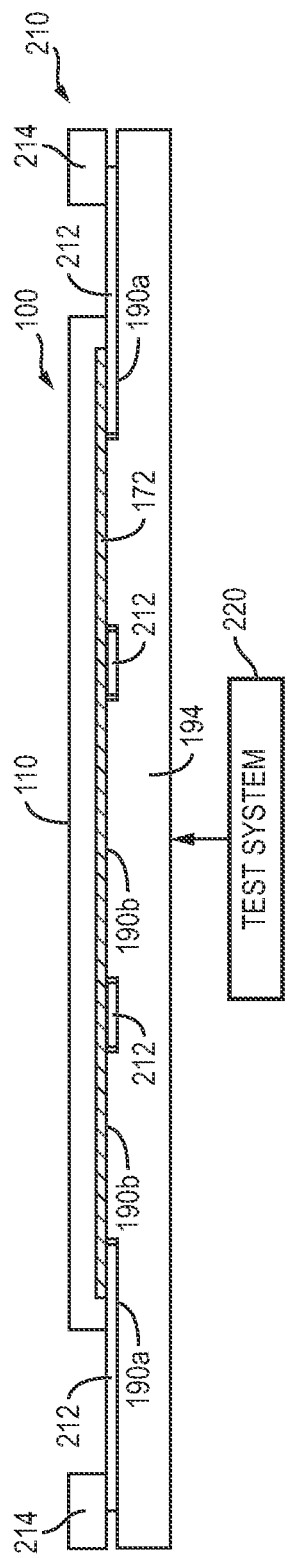
Figure 3K:
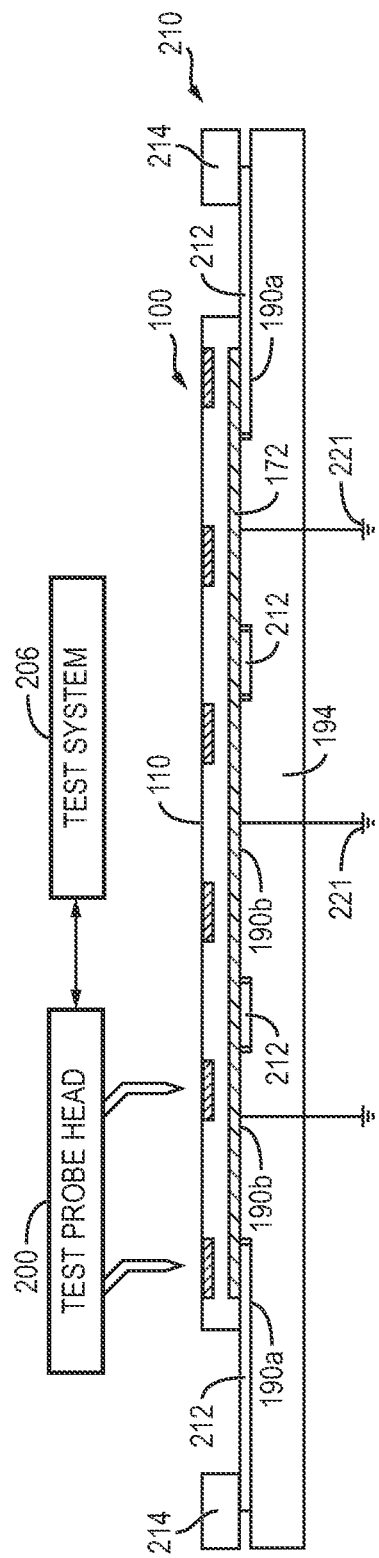
Figure 3L:
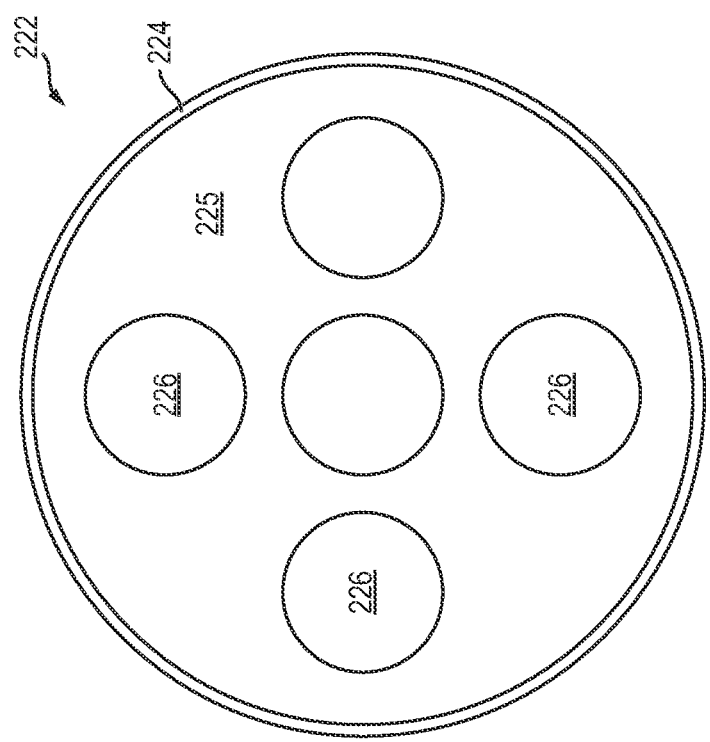
Figure 3M:
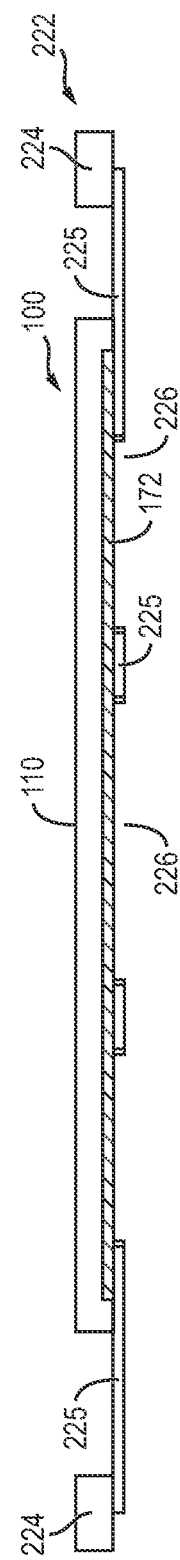
Figure 3Q:
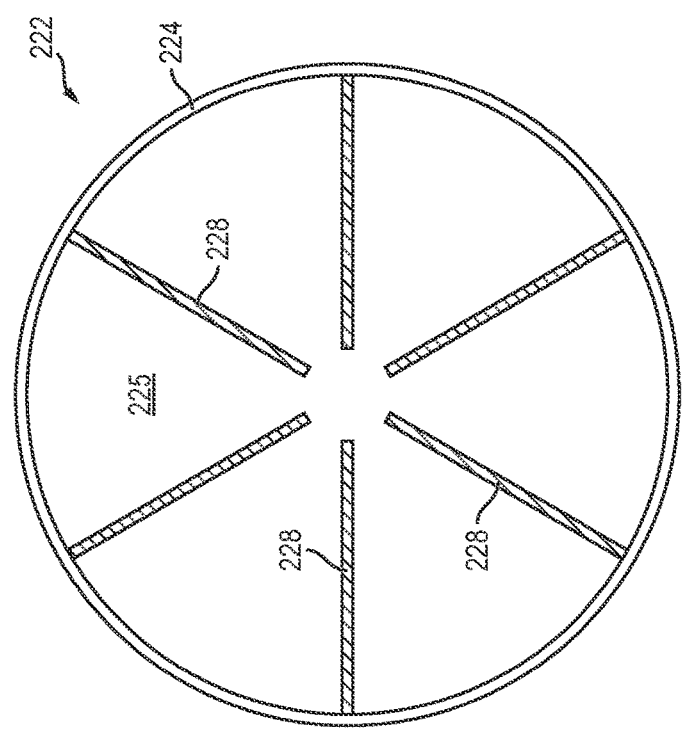
Figure 3R:
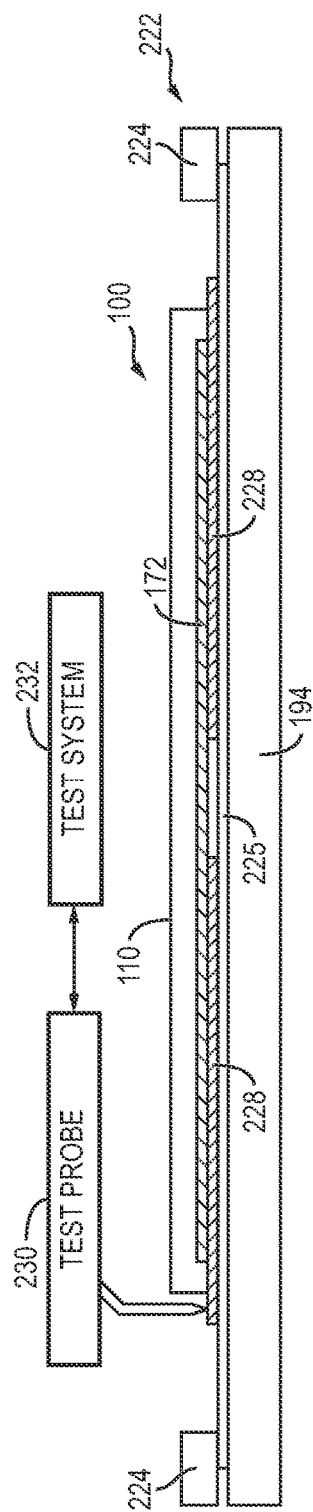
Figure 3S:
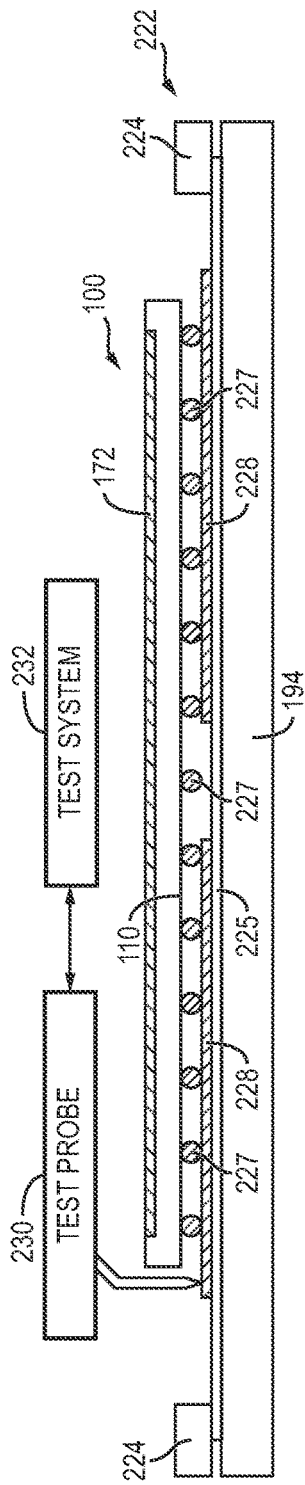
Figure 4A:
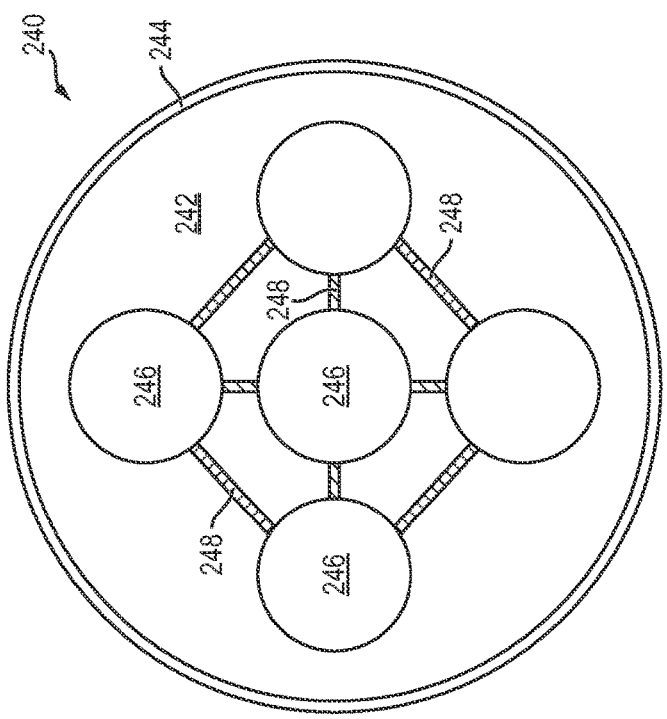
FIGS. 4a-4c illustrate a process of forming conductive channels on the tape.
Figure 4B:
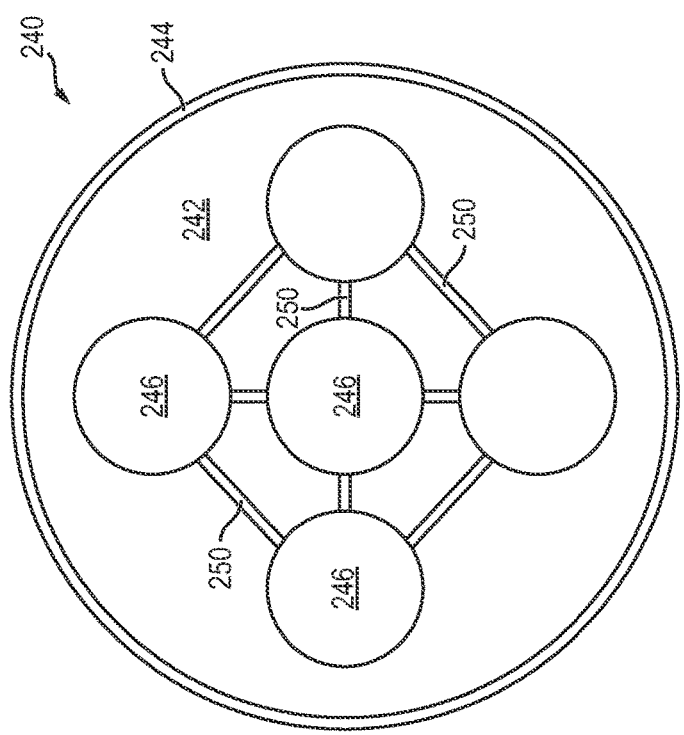
Figure 4C:
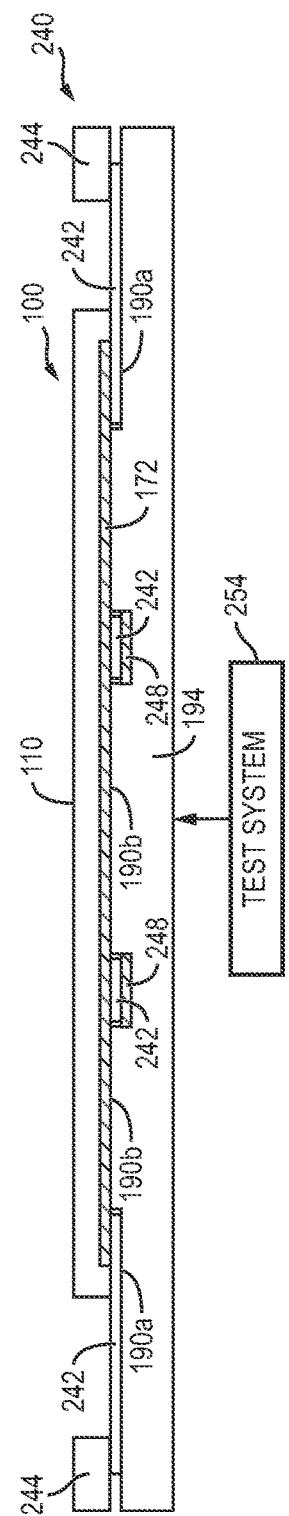

FIGS. 3a-3s illustrate various configurations for probe testing the semiconductor wafer. In FIG. 3a, the thinned semiconductor wafer 100 is removed from film frame 178 and positioned above film frame or carrier 180 with conductive layer 172 on surface 134 oriented toward the film frame. Semiconductor die 104 on the thinned semiconductor wafer 100 have a full feature set, i.e., all functional components and layers have been formed, ready for probe testing of the final semiconductor die. Film frame 180 includes tape portion 182 and edge support 184. In particular, tape portion 182 includes an opening 186 extending through a center region of the tape portion. The thinned semiconductor wafer 100 is positioned over film frame 180 with conductive layer 172 aligned and centered with opening 186. FIG. 3b shows a top view of film frame 180 with tape portion 182 and opening 186 extending through a center region of the tape portion. Semiconductor wafer 100 is mounted to tape portion 182 of film frame 180 with a portion of conductive layer 172 disposed over opening 186. FIG. 3c shows a top view of semiconductor wafer 100 mounted to tape portion 182 of film frame 180. Conductive layer 172 is accessible through opening 186 in tape portion 182.

In FIG. 3d, semiconductor wafer 100 and film frame 180 are positioned over surface 190 of wafer probing chuck 194. Surface 190 has lower portion 190a and raised portion 190b. The raised portion 190b is aligned with opening 186. FIG. 3e shows film frame 180 with semiconductor wafer 100 mounted to surface 190 of wafer probing chuck 194 with tape portion 182 contacting lower portion 190a of surface 190, and raised portion 190b extending through opening 186 to contact conductive layer 172. In one implementation, wafer probing chuck 194 draws a vacuum through ports 193 to hold tape portion 182 and semiconductor wafer 100 securely in place with surface 134 and a first portion of conductive layer 172 held flat against and in contact with tape portion 182, tape portion 182 held flat against and in contact with lower portion 190a of surface 190, and a second portion of conductive layer 172 held flat against and in contact with raised portion 190b of surface 190. In FIG. 3f, a porous ceramic chuck 194, with the same surface 190 including lower portion 190a and raised portion 190b, evenly distributes the vacuum forces to hold semiconductor wafer 100 and film frame 180 flat against lower portion 190a and raised portion 190b of surface 190. Semiconductor wafer 100 and film frame 180 being held flat against lower portion 190a and raised portion 190b of surface 190 by vacuum ports 193 or porous chuck 194 keeps the wafer stable and planar during probe testing. Alternatively, tape portion 182 and semiconductor wafer 100 are held securely in place by a press-fit with force F, as shown in FIG. 3g, with surface 134 and a first portion of conductive layer 172 held flat against and in contact with tape portion 182, tape portion 182 held flat against and in contact with lower portion 190a of surface 190 of chuck 195, and a second portion of conductive layer 172 held flat against and in contact with raised portion 190b of surface 190. Chuck 195 has the same surface 190 with lower portion 190a and raised portion 190b.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

The active and passive components within semiconductor die 104 undergo testing at the wafer-level for electrical performance and circuit function. Each semiconductor die 104 is tested for functionality and electrical parameters. The raised portion 190b of surface 190 of wafer probing chuck 194 makes electrical contact with conductive layer 172 through opening 186. A computer controlled test system 196 sends electrical test signals through wafer probing chuck 194 and raised portion 190b of surface 190, which extends through opening 186, to provide electrical stimuli to conductive layer 172. Alternatively, computer controlled test system 196 sends electrical test signals through conductive channels within wafer probing chuck 194 and raised portion 190b of surface 190 to provide electrical stimuli to conductive layer 172. Conductive layer 172 is coupled to circuits on active surface 110 through TSV or vertically formed semiconductor devices. Semiconductor die 104 responds to the electrical stimuli, which is measured by computer test system 196 and compared to an expected response to test functionality of the semiconductor die.

The testing of semiconductor wafer 100 from the backside directly to conductive layer 172 is achieved through raised portion 190b of surface 190 of wafer probing chuck 194 extending through opening 186 in tape portion 182 of film frame 180. Many testing procedures can be accomplished with wafer probe contact of raised portion 190b to conductive layer 172. For example, the electrical tests may include circuit functionality, lead integrity, resistivity, continuity, reliability, junction depth, ESD, RF performance, drive current, threshold current, leakage current, and operational parameters specific to the component type. The testing is conducted with the thinned semiconductor wafer 100 after wafer grinding. The thinned semiconductor wafer 100 remains flat and stable by nature of lower portion 190a and raised portion 190b of surface 190 of wafer probing chuck 194 held against conductive layer 172. The inspection and electrical testing of semiconductor wafer 100, after wafer thinning, enables semiconductor die 104, with a complete feature set that passes, to be designated as known good die for use in a semiconductor package.

Wafer level testing also encompasses advanced testing procedures, including curve tracing of semiconductor wafer 100 or other characterization of the device, to evaluate detailed electrical and thermal performance of the thin wafer or stacked wafer.

Semiconductor wafer 100 can also be tested from active surface 110, as shown in FIG. 3h. Each semiconductor die 104 is tested for functionality and electrical parameters using a test probe head 200 including a plurality of probes or test leads 202, or other testing device. Probes 202 are used to make electrical contact with nodes or conductive layer 112 on each semiconductor die 104 and provide electrical stimuli to interconnect pads 112. Semiconductor die 104 responds to the electrical stimuli, which is measured by computer test system 206 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

The tape portion may have multiple openings to provide access to different areas of conductive layer 172. As noted above, conductive layer 172 is patterned into electrically common or electrically isolated portions according to the function of semiconductor die 104. FIG. 3i shows a top view of film frame 210 including tape portion 212, edge support 214, and multiple openings 216. Tape portion 212 has as many openings 216 as necessary to perform testing of requisite areas of conductive layer 172. Openings 216 can be cut or punched through tape portion 212 prior to mounting the tape portion to edge support 214, or after mounting the tape portion to the edge support. Cutting openings 216 prior to mounting tape portion 212 to edge support 214 allows for standard cut-out patterns to match specific wafers 100, e.g., a perforated tape. Cutting openings 216 after mounting tape portion 212 to edge support 214 allows for a cut-out pattern customized for a specific wafer 100. Openings 216 can be cut using a laser or blade, or simply remove pre-cut portions of the tape.

Semiconductor wafer 100 is then mounted to tape portion 212, as shown in FIG. 3j. In this case, wafer probing chuck 194 would have multiple raised portions 190b aligned with openings 216. Film frame 210 with semiconductor wafer 100 is mounted to surface 190 of wafer probing chuck 194 with tape portion 212 contacting lower portion 190a of surface 190 and multiple raised portion 190b extending through multiple openings 216 to contact different areas of conductive layer 172. Tape portion 212 and semiconductor wafer 100 are held securely in place by a press-fit or vacuum assist with surface 134 and first portions of conductive layer 172 held flat against and in contact with tape portion 212, tape portion 212 held flat against and in contact with lower portion 190a of surface 190, and second portions of conductive layer 172 held flat against and in contact with raised portion 190b of surface 190. Semiconductor wafer 100 and film frame 210 being held flat against lower portions 190a and raised portions 190b of surface 190 by press-fit or vacuum assist keeps the wafer stable and planar during probe testing.

The multiple raised portions 190b of surface 190 of wafer probing chuck 194 make electrical contact with corresponding areas of conductive layer 172 through openings 216. A computer controlled test system 220 sends electrical test signals through wafer probing chuck 194 and raised portions 190b of surface 190, which extends through openings 216, to provide electrical stimuli to different areas of conductive layer 172. Semiconductor die 104 responds to the electrical stimuli, which is measured by computer test system 220 and compared to an expected response to test functionality of the semiconductor die.

In one implementation, as shown in FIG. 3k, semiconductor wafer 100 is tested from active surface 110, see FIG. 3h, with electrical connection from ground reference node 221 to conductive layer 172 being made through openings 216 in tape portion 212. Multiple portions of conductive layer 172 can be electrically connected to external ground reference node 221 through openings 216. A sample portion of semiconductor wafer 100 can be tested from active surface 110.

Alternatively, wafer ring holder 222 with grip ring 224, as shown in FIG. 3l, can be used for mounting semiconductor wafer 100. Wafer ring holder 222 is typically plastic or other light-weight material for low-cost and ease of handling. Grip ring 224 secures and holds tape portion 225 for mounting semiconductor wafer 100. Openings 226 can be formed in tape portion 225, as described above. Other tape holders can be used to secure tape portion 225 when mounting semiconductor wafer 100.

Alternatively, wafer ring holder 222 with grip ring 224, as shown in FIG. 3l, can be used for mounting semiconductor wafer 100. Wafer ring holder 222 is typically plastic or other light-weight material for low-cost and ease of handling. Grip ring 224 secures and holds tape portion 225 for mounting semiconductor wafer 100. Openings 226 can be formed in tape portion 225, as described above. Other tape holders can be used to secure tape portion 225 when mounting semiconductor wafer 100.

In another implementation, semiconductor wafer 100 is mounted to tape portion 225 without openings 226 to avoid stretching, non-uniformity, or other distortion in the tape portion or openings, see FIG. 3p. Tape portion 225 without openings 226 can also be placed over semiconductor wafer 100. Multiple semiconductor wafers 100 can be mounted to tape sheet or roll while maintaining uniform tension across the tape sheet. Once semiconductor wafer 100 is mounted, openings 226 are cut through tape portion 225 using a laser, blade, or by simply removing pre-cut portions of the tape, similar to FIG. 3l. Tape portion 225 with semiconductor wafer 100 is affixed to grip ring 224 of wafer ring holder 222 either prior to or after cutting openings 226.

In another implementation, semiconductor wafer 100 is mounted to tape portion 225 without openings 226 to avoid stretching, non-uniformity, or other distortion in the tape portion or openings, see FIG. 3p. Tape portion 225 without openings 226 can also be placed over semiconductor wafer 100. Multiple semiconductor wafers 100 can be mounted to tape sheet or roll while maintaining uniform tension across the tape sheet. Once semiconductor wafer 100 is mounted, openings 226 are cut through tape portion 225 using a laser, blade, or by simply removing pre-cut portions of the tape, similar to FIG. 3l. Tape portion 225 with semiconductor wafer 100 is affixed to grip ring 224 of wafer ring holder 222 either prior to or after cutting openings 226.

In another implementation, semiconductor wafer 100 is mounted to tape portion 225 without openings 226 to avoid stretching, non-uniformity, or other distortion in the tape portion or openings, see FIG. 3p. Tape portion 225 without openings 226 can also be placed over semiconductor wafer 100. Multiple semiconductor wafers 100 can be mounted to tape sheet or roll while maintaining uniform tension across the tape sheet. Once semiconductor wafer 100 is mounted, openings 226 are cut through tape portion 225 using a laser, blade, or by simply removing pre-cut portions of the tape, similar to FIG. 3l. Tape portion 225 with semiconductor wafer 100 is affixed to grip ring 224 of wafer ring holder 222 either prior to or after cutting openings 226.

In another implementation, semiconductor wafer 100 is mounted to tape portion 225 without openings 226 to avoid stretching, non-uniformity, or other distortion in the tape portion or openings, see FIG. 3p. Tape portion 225 without openings 226 can also be placed over semiconductor wafer 100. Multiple semiconductor wafers 100 can be mounted to tape sheet or roll while maintaining uniform tension across the tape sheet. Once semiconductor wafer 100 is mounted, openings 226 are cut through tape portion 225 using a laser, blade, or by simply removing pre-cut portions of the tape, similar to FIG. 3l. Tape portion 225 with semiconductor wafer 100 is affixed to grip ring 224 of wafer ring holder 222 either prior to or after cutting openings 226.

The wafer ring holder and semiconductor wafer 100 are moved from wafer probing chuck 194 and the thinned semiconductor wafer 100 is singulated through saw streets 106 using a saw blade or laser cutting tool or plasma etch into individual semiconductor die 104. The individual semiconductor die 104 from the thinned semiconductor wafer 100 have been probe tested in the final configuration of the semiconductor die.

Figures 5, 6:
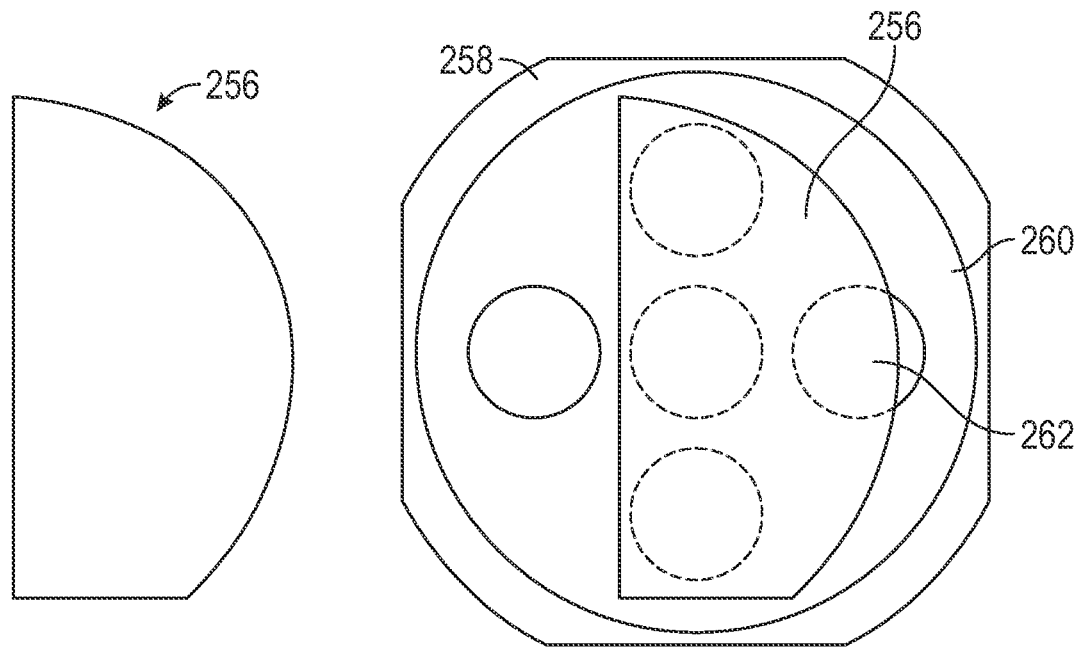
FIG. 5 is a top view of an implementation of a partial wafer/substrate.
FIG. 6 is a top view of an implementation of partial wafer mounted to a support structure mounted to a wafer holder.

In various implementations, partial semiconductor wafers/substrates may be used in methods of testing semiconductor devices as described herein. Referring to FIG. 5, an example of a partial semiconductor wafer 256 is illustrated. In various implementations, the partial wafer may include a broken wafer, a sawed wafer, a cracked wafer, a chipped wafer, one or more die, one or more stacked die, an array of die, or any other configuration that is not a full/intact semiconductor wafer. The partial semiconductor wafer may have a first side and a second side. The first side of the semiconductor wafer may include an active surface. The second side of the semiconductor wafer may include an inactive surface. In some implementations, one or more portions of the second side of the semiconductor wafer may be active. Traces may run from a first side of the semiconductor wafer to the second side of the semiconductor wafer. The partial semiconductor wafer 256 may be mounted to a wafer carrier 258 including a support structure 260 as illustrated in FIG. 6. In some implementations, the support structure 260 may include a tape, a film, or other flexible material. In some implementations, the film may not be a stretchable film (a non-stretchable film). As used herein, a non-stretchable film is any film that cannot be stretched greater than 1 mm by applying force substantially parallel with the largest planar surface of the film.

In various implementations, the first side of the semiconductor wafer may be mounted to the support structure. In other implementations, the second side of the semiconductor wafer may be mounted to the support structure. The partial semiconductor wafer may be secured to the wafer holder and support structure through an adhesive material. The adhesive material may be coupled to the edges of the wafer holder. In some implementations, the adhesive may be reusable. In various implementations, the adhesive may be on the tape or film.

Implementations of the partial wafer may be tested through one or more openings 262 in the support structure 260 coupled with the wafer holder. In other implementations, the support structure may have no openings. In some implementations, the support structure may be made of an electrically conductive material. In other implementations, a probe used in testing may form holes in the support structure at the time of testing, such as when the probe is inserted through the film to contact the wafer at the time of testing. Implementations of partial wafers may include large die which have been pre-sawn before testing.

Figures 7, 8:
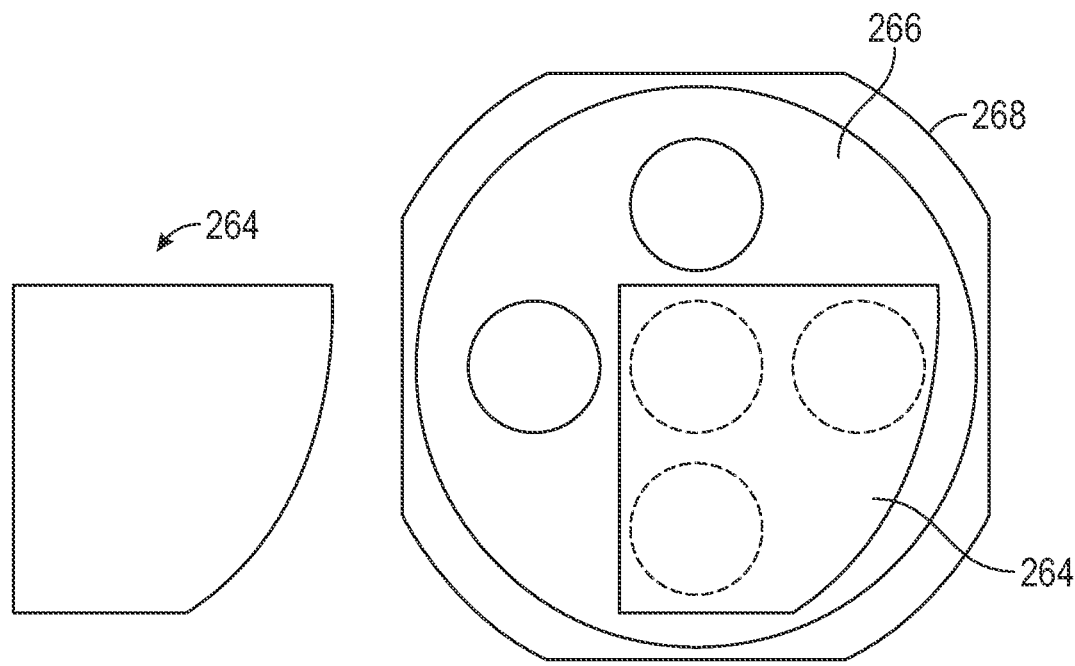
FIG. 7 is a top view of another implementation of a partial wafer.
FIG. 8 is a top view of another implementation of partial wafer mounted to a support structure mounted to a wafer holder.

Referring to FIG. 7, another example of a partial wafer 264 is illustrated. A method of testing a partial wafer may include mounting the partial wafer to a support structure. The support structure may include a tape or a film. The tape or film may be coupled with a wafer holder prior to mounting the partial wafer. In other implementations, the partial wafer may be mounted to the support structure and then the support structure may be mounted to the wafer holder. As illustrated in FIG. 8, a partial wafer 264 is mounted to a support structure 266 coupled with a wafer holder 268. In various implementations described herein, the partial wafer may include an edge ring such as a Taiko edge ring formed through the Taiko method of DISCO Corporation of Tokyo, Japan. In other implementations, the partial wafer of the substrate may include no edge ring. The wafer may be tested using a probe/pin on a second side of the wafer holder. Though the support structure in FIG. 8 includes five openings, in other implementations, the support structure may include no openings or a plurality of openings like those disclosed herein. In implementations including no openings in the support structure, the support structure may be formed of and electrically conductive material. In other implementations where the support structure includes no openings, one or more openings may be formed in the support structure using the probe during testing.

The method may include testing the partial wafer or substrate with the probe/pin. After testing the wafer, the method may include sawing the wafer into one or more die. In some implementations, the wafers may be sawed or singulated before testing of the wafer. The tape/film may aid to keep the die properly aligned and in the desired x, y, and z orientation during sawing. Testing the die after sawing/singulation may help to ensure quality of remaining die if some die are damaged during the singulation process. This process may be used with stacked die as well as with partial and full wafers. In implementations including tape, the tape may be stretched to separate the singulated die. The method may then include removing the singulated die through a pick and place process and assembling the die into semiconductor devices. The method may include aligning the partial wafer before singulating the die. In some implementations, the partial wafer may be aligned before or immediately after mounting the wafer to the support structure.

Figure 9:
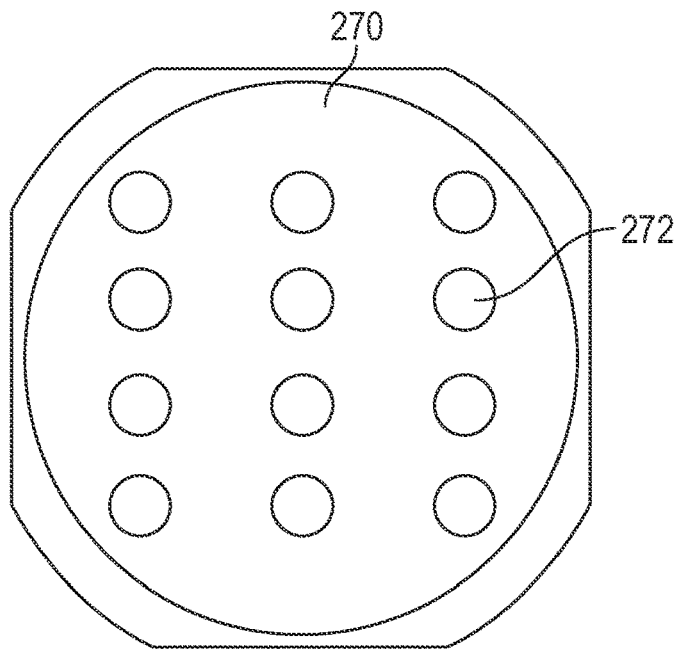
FIG. 9 is a bottom view of an implementation of a support structure coupled with a wafer holder, the support structure including a plurality of holes.

In various implementations of the methods described herein, the support structure may include a tape, a film, or a carrier. Referring to FIG. 9, an implementation of a support structure 270 including a plurality of openings 272 is illustrated. In various implementations, the openings may be smaller than the various die included on the semiconductor substrate. The plurality of smaller openings in the support structure may better be able to accommodate partial semiconductor wafers and substrates. This is especially true when the partial substrates are individual die. The plurality of smaller openings may also allow a single tape to be used for sawing and for picking the die from the tape as, by non-limiting example, the smaller openings still permit vacuum to be maintained from the sawing chuck during sawing. The smaller openings may also allow multiple contacts across the wafer during testing for the probes/pins.

Figure 13:
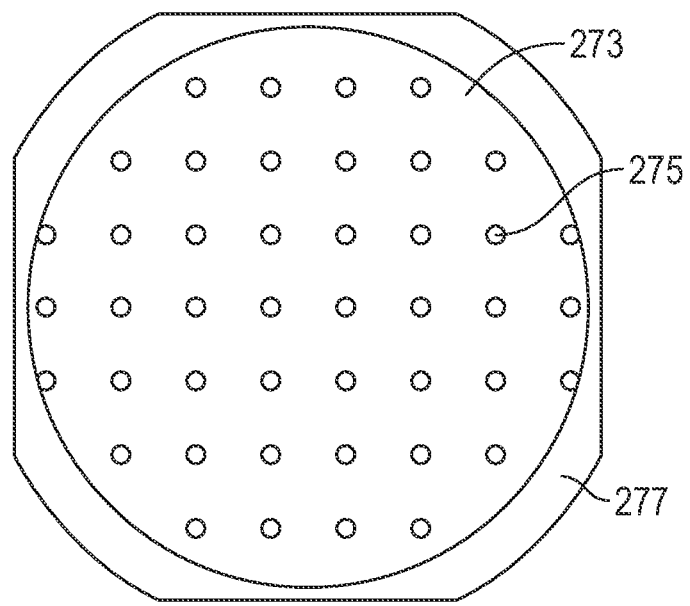
FIG. 13 is a bottom view of an implementation of a support structure coupled with a wafer holder, the support structure including a plurality of holes.

Another implementation of a support structure 273 having a plurality of openings 275 is illustrated in FIG. 13. The plurality of holes may be formed using a perforator in various implementations. The perforator may provide uniform sized and spaced openings during, immediately before, or immediately after the mounting process of the substrate in the same process tool that does the mounting. In other implementations, the plurality of holes may be formed using other instruments that are capable of forming small openings. In some implementations the openings may be formed using a laser. The holes may be formed in the support structure before or after coupling the support structure to the wafer carrier 277. In still other implementations, the openings may be formed by the manufacturer of the support structure during part of the manufacturing process.

In various implementations of a method for testing wafers, the wafers may be transferred to a new tape by flipping the wafer onto a temporary tape or other intermediate surface. The wafer may be flipped again onto a final dicing tape. In various implementations, the tapes may be ultraviolet (UV) cured/exposed to decrease any adhesion of the die to the tape for picking the die off the tape. In some implementations, temperature release tapes may be used.

In some implementations, transferring the wafer may include flipping the wafer onto a temporary film. The wafer may be probed for testing upside down on the original tape and the probes may access the wafer through the one or more openings in the tape or film. Using this method, while not every die would be tested, a large percentage of the wafer could be tested to increase the odds that the remaining die are good die. Decreasing the number of times a wafer needs to be flipped may be especially helpful for ultra-thin wafers having a thickness between about 3 to about 35 µm.

Another implementation of a method to decrease the flipping or handling of the wafers may include adding temporary traces to the tape, film, or support structure. In some implementations, a metal spatula may be used a temporary trace as it can be inserted/added and removed with little movement of the wafer. The temporary traces may include conductive material in strip lines or blocks like a spatula. The temporary traces may be under the wafer, or in other words the temporary traces may be between the tape and the wafer. In various implementations, the temporary traces may be positioned along the edges of the wafer. The use of temporary traces on the edges of the wafer may work, by non-limiting example, with Taiko thinned dies. The temporary traces may also be used with partial wafers and individual die. Implementations of methods for testing wafers using temporary traces, may include contacting the temporary traces with a probe. The temporary trace is maintained in contact with the backside of the wafer during testing. The method further includes removing the strips by pulling on the strips after testing thereby decreasing the need to flip the wafers. After removal of the strips the wafers may be singulated. In various implementations, the wafers may be singulated through sawing.

Figure 10:
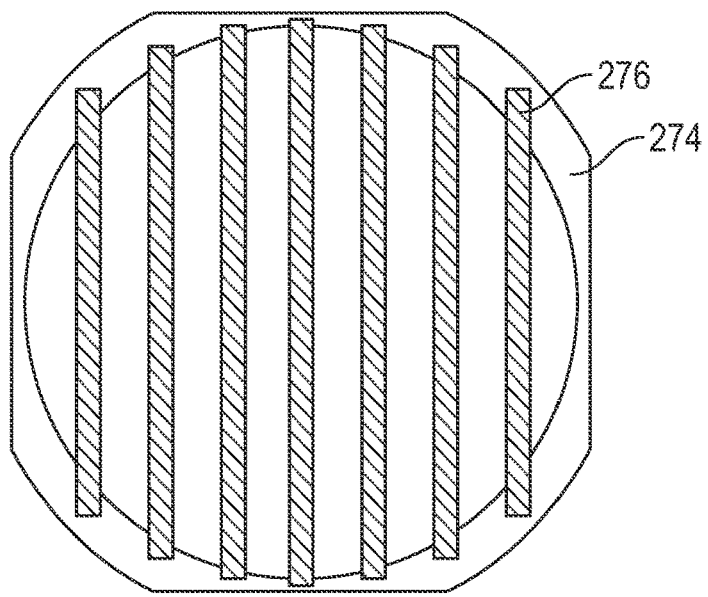
FIG. 10 is a bottom view of an implementation of a wafer holder having strips of tape coupled thereto.
Figure 11:
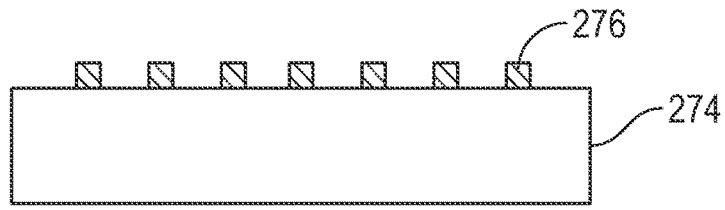
FIG. 11 is a side view of an implementation of a wafer holder having strips of tape coupled thereto.
Figure 12:
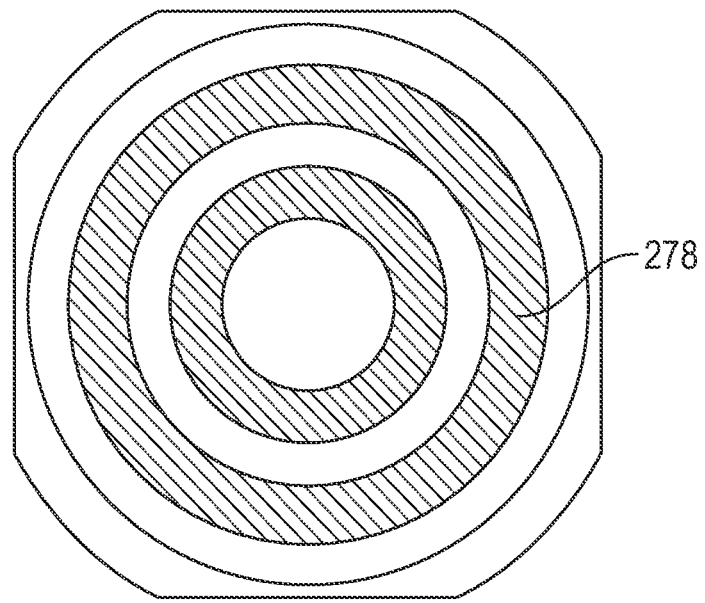
FIG. 12 is a bottom view of an implementation of a wafer holder having circular pieces of tape coupled thereto.

Referring to FIG. 10, a top view of the second side of an implementation of a wafer holder 274 including individual pieces of tape 276 is illustrated. FIG. 11 illustrates a side view of the wafer holder 274 having individual tape pieces 276 coupled thereto. In various implementations, the individual pieces of tape may be strips having a rectangular shape. In various implementations, the tape may be between about 1 to about 3 inches wide and the spacing between the tape may be between about 0.5 to about 4 inches. In various other implementations, however, the tape strip width may be wider or narrower and the spacing between the tape may be wider or narrower. In other implementations, the tape may have circular shapes 278 as illustrated in FIG. 12. Individual pieces of tape would make removing the backside tape easier for mounting the wafer to the final dicing tape. Using strips of tape may decrease the cost of processing the wafer. Also, strips of tape that interlace or cross at substantially perpendicular or lesser angles may be employed in various implementations. In some implementations, the strips of tape may not completely fill the support/frame and may be constructed to fit just the size of the partial wafer being processed.

The spaces between the pieces of tape may allow greater contact between the testing probe and the wafer. By non-limiting example, the wafer could be tested from left to right or from a top edge of the wafer to a bottom edge of the wafer. In various implementations, the tape may be electrically conductive or nonconductive. The tape may be stretchable or non-stretchable like any tape disclosed herein. In alternate implementations, strips of film may also be used. The tape or film may be cured/exposed to ultraviolet light after testing to reduce adhesion of the tape to the wafer before removal. In various implementations, custom patterns of tape or film may be coupled to a second side of the wafer holder. Custom patterns may be especially useful when working with partial wafers and individual die.

In some implementations, the support structure may include a film. In various implementations, the film may be non-stretchable. A method of testing a semiconductor substrate may include testing a probe on a wafer carrier as previously described. The wafer or partial wafer may then be transferred to a flexible tape. In various implementations, the wafer may be transferred through flipping the wafer from the wafer carrier to the tape. The method then includes singulating a plurality of die on the wafer. The die may be singulated through sawing. In some implementations, the dies may be singulated through laser cutting. The flexible tape may then be stretched to separate the die and the die may be picked from the tape. In various implementations, the film may be conductive to facilitate testing of the wafer or partial wafer through the film. The film may be made of carbon or other similar materials. In some implementations, the film may be similar to carbon wafer separators. The carbon wafer separators may be coupled to the wafer holder or film frame through adhesive or tape. In other implementations, the film may be coated with gold, copper, aluminum or other conductive metals. In other implementations, the film may have openings as illustrated herein.

In places where the description above refers to particular implementations of methods for testing semiconductor wafers and implementing components, sub-components, methods and sub-methods, it should be readily apparent that a number of modifications may be made without departing from the spirit thereof and that these implementations, implementing components, sub-components, methods and sub-methods may be applied to other methods for testing semiconductor wafers.

What is claimed is:

1. A method of probe testing a semiconductor wafer, comprising:
    providing a partial semiconductor wafer;
    providing a wafer holder including a support structure with a plurality of openings through the support structure;
    mounting the partial semiconductor wafer over the plurality of openings in the support structure of the wafer holder; and providing an electrical connection to the partial semiconductor wafer through the plurality of openings in the support structure during probe testing.

2. The method of claim 1, wherein the partial semiconductor wafer comprises one or more singulated die.

3. The method of claim 1, providing the partial semiconductor wafer comprises providing one or more stacked semiconductor die.

4. The method of claim 1, further comprising forming one or more temporary electrically conductive traces over the support structure.

5. The method of claim 1, further comprising forming the plurality of openings through the support structure after mounting the support structure to the wafer holder.

6. The method of claim 1, further comprising forming the plurality of openings through the support structure prior to mounting the support structure to the wafer holder.

7. The method of claim 1, wherein the plurality of openings comprise a plurality of openings formed as strips.

8. The method of claim 1, wherein the plurality of openings comprise a plurality of openings formed as rings.

9. An apparatus for probe testing a semiconductor device, comprising:
   a semiconductor wafer; and
   a wafer holder including a support structure with one or more openings through the support structure;
   wherein the semiconductor wafer is mounted over the one or more openings in the support structure of the wafer holder;
   wherein the one or more openings in the support structure is configured to establish an electrical connection to the semiconductor wafer through the one or more openings in the support structure during probe testing; and
   wherein the support structure is substantially non-stretchable.

10. The apparatus of claim 9, wherein the semiconductor wafer comprises a partial semiconductor wafer.

11. The apparatus of claim 9, wherein the semiconductor wafer comprises one or more stacked semiconductor die.

12. The apparatus of claim 9, wherein the support structure of the wafer holder is electrically conductive.

13. The apparatus of claim 9, wherein the support structure of the wafer holder is carbon coated with one of gold, copper, aluminum, or any combination thereof.

14. The apparatus of claim 9, the wafer holder further comprising an adhesive on one or more edges of the wafer holder.

15. The apparatus of claim 9, wherein the one or more openings in the support structure have a size smaller than a size of an individual die.

16. The apparatus of claim 9, wherein the one or more openings comprise a plurality of openings in a form of a plurality of strips.

17. The apparatus of claim 9, wherein the one or more openings comprise a plurality of openings in a form of a plurality of rings.

18. The apparatus of claim 9, wherein the semiconductor wafer is removably mounted over the one or more openings in the support structure.

19. An apparatus for probe testing a semiconductor device, comprising:
   a wafer holder including a support structure with one or more openings through the support structure;
   wherein the wafer holder is configured to hold a semiconductor wafer over the one or more openings in the support structure of the wafer holder;
   wherein the one or more openings in the support structure is configured to establish an electrical connection to the semiconductor wafer through the one or more openings in the support structure during probe testing; and
   wherein the support structure is substantially non-stretchable.

20. The apparatus of claim 19, further comprising a conductive trace formed on the support structure, wherein the conductive trace is configured to establish an electrical connection to the semiconductor wafer through the conductive trace during probe testing.

* * * * *